US00RE35785E

United States Patent [19]

Sandhu et al.

[11] E Patent Number: Re. 35,785

[45] Reissued Date of Patent: May 5, 1998

[54] LOW-PRESSURE CHEMICAL VAPOR DEPOSITION PROCESS FOR DEPOSITING HIGH-DENSITY HIGHLY-CONFORMAL, TITANIUM NITRIDE FILMS OF LOW BULK RESISTIVITY

[75] Inventors: Gurtej S. Sandhu, Boise, Id.; Todd W. Buley, Mesa, Ariz.

[73] Assignee: Micron Technology, Inc., Boise, Id.

[21] Appl. No.: 570,613

[22] Filed: Sep. 21, 1995

Related U.S. Patent Documents

Reissue of:

[64] Patent No.: 5,246,881
Issued: Sep. 21, 1993
Appl. No.: 46,685
Filed: Apr. 14, 1993

[51] Int. Cl.[6] ..... H01L 21/285

[52] U.S. Cl. ..... 438/681; 438/685; 427/99; 427/255.1; 427/573

[58] Field of Search ..... 437/190, 192, 437/245, 246; 427/99, 248.1, 255.1, 569, 573, 255.2; 118/723 ME, 723 ER, 723 IR; 438/681, 685

[56] References Cited

U.S. PATENT DOCUMENTS

| | | | |
|---|---|---|---|
| 5,082,517 | 1/1992 | Moslehi | 156/345 |
| 5,089,438 | 2/1992 | Katz | 437/184 |
| 5,139,825 | 8/1992 | Gordon et al. | 427/255.2 |
| 5,178,911 | 1/1993 | Gordon et al. | 427/255.2 |
| 5,192,589 | 3/1993 | Sandhu | 427/255.1 |
| 5,227,334 | 7/1993 | Sandhu | 437/190 |
| 5,252,518 | 10/1993 | Sandhu et al. | 437/200 |
| 5,254,499 | 10/1993 | Sandhu et al. | 437/192 |
| 5,399,379 | 3/1995 | Sandhu | 427/255.2 |

OTHER PUBLICATIONS

Fix, R.M., et al., "Synthesis of Thin Films . . . ," *Chem. Mater.*, vol. 2, No. 3, 1990, pp. 235–241.

Sherman, A., "Growth and Properties of Low Pressure . . . ", *Japanese J. Appl. Phys.*, vol. 30, No. 12B, Dec. 1991, pp. 3553–3557.

Sandhu, G.S., et al., "Metalorganic Chemical Vapor Deposition of TiN . . . ", *Appl. Phys. Lett.*, 62(3), 18 Jan. 1993, pp. 240–242.

Intemann, A., et al., "Films Properties of CVD Titanium Nitride . . . ", *J. Electrochem. Soc.*, vol. 140, No. 11, Nov. 1993, pp. 3215–3222.

*Primary Examiner*—T. N. Quach
*Attorney, Agent, or Firm*—Trask, Britt & Rossa

[57] ABSTRACT

A low-pressure chemical vapor deposition process is disclosed for creating high-density, highly-conformal titanium nitride films which have very low bulk resistivity, and which provide excellent step coverage. The process utilizes a metal-organic compound, tetrakis-dialkylamido-titanium $Ti(NR_2)_4$, as the primary precursor, in combination with an activated species which attacks the alkyl-nitrogen bonds of the primary precursor, and which will convert the displaced alkyl groups into a volatile compound. Any noble gas, as well as nitrogen or hydrogen, or a mixture of two or more of the foregoing may be used as a carrier for the precursor. The activated species, which may include a halogen, $NH_3$, or hydrogen radicals, or a combination thereof, are generated in the absence of the primary precursor, at a location remote from the deposition chamber. The wafer is heated to a temperature within a range of 200°–600° C. The primary precursor molecules and the activated species are mixed, preferably, just prior to being ducted into the deposition chamber. Relatively uncontaminated titanium nitride deposits on the heated wafer surface.

28 Claims, 1 Drawing Sheet

LOW-PRESSURE CHEMICAL VAPOR DEPOSITION PROCESS FOR DEPOSITING HIGH-DENSITY HIGHLY-CONFORMAL, TITANIUM NITRIDE FILMS OF LOW BULK RESISTIVITY

Matter enclosed in heavy brackets [ ] appears in the original patent but forms no part of this reissue specification; matter printed in italics indicates the additions made by reissue.

FIELD OF THE INVENTION

This invention relates to integrated circuit manufacturing technology and, more specifically, to processes for depositing titanium carbonitride films via chemical vapor deposition.

BACKGROUND OF THE INVENTION

The compound titanium nitride (TiN) has numerous potential applications because it is extremely hard, chemically inert (although it readily dissolves in hydrofluoric acid), an excellent conductor, possesses optical characteristics similar to those of gold, and has a melting point around 3000° C. This durable material has long been used to gild inexpensive jewelry and other art objects. However, during the last ten to twelve years, important uses have been found for TiN in the field of integrated circuit manufacturing. Not only is TiN unaffected by integrated circuit processing temperatures and most reagents, it also functions as an excellent barrier against diffusion of dopants between semiconductor layers. In addition, TiN also makes excellent ohmic contact with other conductive layers.

In a common application for integrated circuit manufacture, a contact opening is etched through an insulative layer down to a diffusion region to which electrical contact is to be made. Titanium metal is then sputtered over the wafer so that the exposed surface of the diffusion region is coated. The titanium metal is eventually converted to titanium silicide, thus providing an excellent conductive interface at the surface of the diffusion region. A titanium nitride barrier layer is then deposited, coating the walls and floor of the contact opening. Chemical vapor deposition of tungsten or polysilicon follows. In the case of tungsten, the titanium nitride layer provides greatly improved adhesion between the walls of the opening and the tungsten metal. In the case of the polysilicon, the titanium nitride layer acts as a barrier against dopant diffusion from the polysilicon layer into the diffusion region.

At least five techniques are currently available for creating thin titanium nitride films having low bulk resistivity: reactive sputtering; annealing of an already deposited titanium layer in a nitrogen ambient; a high-temperature atmospheric pressure chemical vapor deposition (APCVD) process, using titanium tetrachloride, nitrogen and hydrogen as reactants; a low-temperature APCVD process, using ammonia and $Ti(NR_2)_4$ compounds as precursors; a LPCVD; and a low-pressure CVD process using ammonia and $Ti(NMe_2)_4$ as precursors. Each of these four processes has its associated problems.

Both reactive sputtering and nitrogen ambient annealing of deposited titanium result in films having poor step coverage, which are not useable in submicron processes. Chemical vapor deposition processes have an important advantage in that a conformal layers of any thickness may be deposited. This is especially advantageous in ultra-large-scale-integration circuits, where minimum feature widths may be smaller than 0.5μ. Layers as thin as 10⅛ may be readily produced using CVD. However, TiN coatings prepared used the high-temperature APCVD process must be prepared at temperatures between 900°–1000° C. The high temperatures involved in this process are incompatible with conventional integrated circuit manufacturing processes. Hence, depositions using the APCVD process are restricted to refractory substrates such as tungsten carbide. The low-temperature APCVD, on the other hand, though performed within a temperature range of 100°–400° C. that is compatible with conventional integrated circuit manufacturing processes, is problematic because the precursor compounds (ammonia and $Ti(NR_2)_4$) react spontaneously in the gas phase. Consequently, special precursor delivery systems are required to keep the gases separated during delivery to the reaction chamber. In spite of special delivery systems, the highly spontaneous reaction makes full wafer coverage difficult to achieve. Even when achieved, the deposited films tend to lack uniform conformality, are generally characterized by poor step coverage, and tend to deposit on every surface within the reaction chamber, leading to particle problems. Finally, the low-pressure CVD process, though producing layers of uniform thickness, does not provide acceptable step coverage for high aspect ratio trenches.

SUMMARY OF THE INVENTION

This invention is a process for depositing high-density, highly-conformal titanium nitride films which have very low bulk resistivity and excellent step coverage. The deposition process takes place in a low-pressure chamber (i.e, a chamber in which pressure has been reduced to between 0.1 and 100 Torr prior to deposition), and utilizes a metal-organic compound, tetrakis-dialkylamido-titanium $Ti(NR_2)_4$, as the primary precursor in combination with an activated species which attacks the alkyl-nitrogen bonds of the primary precursor, and which will convert the displaced alkyl groups into a volatile compound. Any noble gas, as well as nitrogen or hydrogen, or a mixture of two or more of the foregoing may be used as a carrier for the precursor. The activated species, which may include halogen, $NH_3$, or hydrogen radicals, or a combination thereof, are generated in the absence of the primary precursor, at a location remote from the deposition chamber. Remote generation of the activated species is required because it is not desirable to employ a plasma CVD process, as $Ti(NR_2)_4$ is known to break down in plasma, resulting in large amounts of carbon in the deposited film. A high carbon content will elevate the bulk resistivity of the film to levels that are unacceptable for most integrated circuit applications. The wafer is heated to a temperature within a range of 200°–600° C. The primary precursor molecules and the activated species are mixed, preferably, just prior to being ducted into the deposition chamber. It is hypothesized that as soon as the mixing has occurred, the activated species begin to tear away the alkyl groups from the primary precursor molecules. Relatively uncontaminated titanium nitride deposits on the heated wafer surface.

PREFERRED EMBODIMENT OF THE INVENTION

Figure 1:
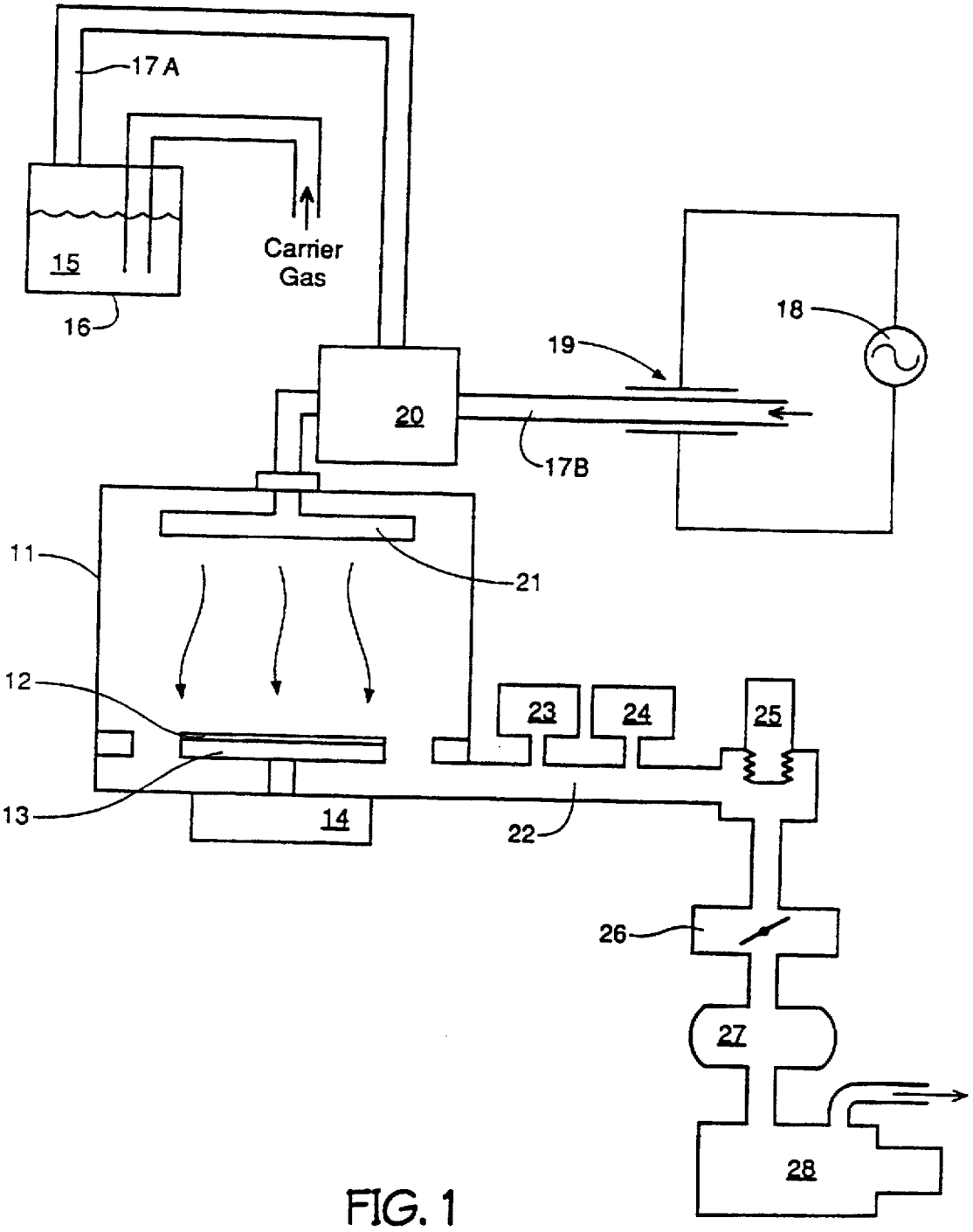
FIG. 1 is a block schematic diagram of the low-pressure chemical vapor deposition reactor system and the remote plasma generation equipment used for the subject process.

The new process for depositing high-density, highly-conformal titanium nitride films which have very low bulk resistivity and excellent step coverage, will be described in reference to the low-pressure chemical vapor deposition reactor system depicted in FIG. 1. The deposition process takes place in a cold wall chamber 11 in which pressure has been reduced to between 0.1 and 100 torr. A pressure of 0.5 torr is deemed to be optimum. A wafer 12, on which the deposition will be performed, is mounted on a susceptor 13, which is heated to a temperature within a range of 200°–600° C. by a heat lamp array 14. A wafer temperature of about 400° C. is deemed to be optimum for integrated circuit manufacture. A carrier gas selected from a group consisting of the noble gases and nitrogen and hydrogen is bubbled through liquid tetrakis-dialkylamido-titanium 15, the primary precursor compound, in a bubbler apparatus 16. A carrier gas flow rate of 100 scc/min. was maintained through the bubbler apparatus 16 during the deposition process, and the primary precursor compound 15 was maintained at a constant temperature of approximately 40° C. Other techniques for vaporizing a semivolatile compound are also known in the art and may be used in place of the bubbler apparatus.

Tetrakis-dialkylamido-titanium, or $Ti(R_2)_4$, molecularly consists of a titanium atom to which four nitrogen atoms are single bonded, with each nitrogen atom also being single bonded to a pair of alkyl groups. It should be noted that tetrakis-dialkylamido-titanium is a family of compounds, of which tetrakis-dimethylamido-titanium, tetrakis-diethylamido-titanium and tetrakis-dibutylamido-titanium has been synthesized. Because of its lower carbon content per unit of molecular weight, the first compound is preferred because there is less carbon available to be incorporated as an impurity into the film. Nevertheless, any of the three compounds or any combination of the three compounds are deemed to be operative for the present invention.

Referring once again to FIG. 1, the carrier gas, at least partially saturated with vaporized primary precursor compound 15, is transported via a primary intake manifold 17A to a premix chamber 20. A secondary precursor compound is introduced into a secondary intake manifold 17B. The secondary precursor compound passes between a pair of plates 19 to which a radio frequency (RF) voltage is applied by RF generator 18. The portion of the secondary intake manifold 17B passing between plates 19 is constructed from quartz in order to permit the effect of the RF field to be exerted Referring once again to FIG. 1, the mixture of primary precursor compound, activated secondary precursor compound, and carrier gas is ducted from premix chamber 20 to a shower head 21, from which they enter the chamber 11. Relatively uncontaminated titanium nitride deposits on the surface of the heated wafer 12. Reaction products and carrier gas are withdrawn from the chamber 11 via an exhaust manifold 22. Incorporated in the exhaust manifold 22 are a pressure sensor 23, a pressure switch 24, a vacuum valve 25, a pressure control valve 26, a blower 27, and a particulate filter, which filters out solid reactants before the exhaust is vented to the atmosphere. During the deposition process, the pressure within chamber 11 is maintained within a pressure of preferably, but not limited to, 0.1 to 100 torr by pressure control components 23, 24, 25, 26, and 27.

Experiments have been performed using both $Cl_2$ and $NF_3$ as secondary precursor compounds. A control process was run in which the primary precursor compound was pyrolized in the absence of a secondary precursor compound (activated or unactivated). The following chart provides bulk resistivity values for films having a thickness of about 150⅛ deposited using the various processes.

| Process | Resistivity (in μohm-cm) |
|---|---|
| Control | 16,800 |
| $Cl_2$ | 4,500 |
| $NF_3$ | 2,000 |
| $NH_3$ | 1,700 |

Conformality of the titanium nitride films deposited by the subject process has been experimentally observed to be therein. A plasma discharge is struck and maintained as the secondary precursor compound passes through the quartz portion of the secondary manifold between the plates 19, resulting in activated species. The secondary precursor compound, containing activated species, is ducted into premix chamber 20, where it is mixed with the vaporized primary precursor compound 15 and the carrier gas.

The secondary precursor compound is chosen, such that when activated by the RF voltage, activated species result which attack the alkyl-nitrogen bonds of the primary precursor compound, and which will convert the displaced alkyl groups into a volatile compound. The activated species, which may include halogen, $NH_3$, or hydrogen radicals, or a combination thereof, must be generated in the absence of the primary precursor compound, at a location remote from the deposition chamber. Remote generation of the activated species is essential because it is not desirable to employ a plasma CVD process, as $Ti(NR_2)_4$ is known to break down in plasma, resulting in large amounts of carbon in the deposited film. A high carbon content will elevate the bulk resistivity of the film to levels that are unacceptable for most integrated circuit applications. It is hypothesized that as soon as the mixing of the activated species and the primary precursor compound has occurred, the activated species begin to tear away the alkyl groups from the primary precursor molecules. Thus, the primary precursor molecules and the activated species are mixed, preferably, just prior to being ducted into the deposition chamber. within a range of 5% of the average thickness.

For the films deposited by the subject process, film thickness step coverage on vertical wall portions near the base of 0.5μ-wide, 2.5μ-deep contact openings is greater than 90 percent of the horizontal film thickness near the top of the openings.

Although only a single embodiment of the inventive process has been disclosed herein, it will be obvious to those having ordinary skill in the art that modifications and changes may be made thereto without affecting the scope and spirit of the invention as claimed. For example, other metal-organic titanium compounds which have bonds with reactivities similar to those of tetrakis-dialkylamido-titanium will likely react in a similar manner and with similar results. It is also to be understood that the process parameters disclosed herein are meant to be illustrative, and are not meant to be limiting. In addition, it should be understood that titanium nitride may be deposited on substrates other than a semiconductor wafers using the subject process.

We claim:

1. A chemical vapor deposition process for depositing a titanium nitride film on a substrate, said process comprising the steps of:

(1) disposing the substrate on a heated susceptor plate within a chemical vapor deposition chamber;

(2) admitting a mixture of vaporized tetrakis-dialkylamido-titanium as the primary precursor compound and an activated species into said chamber, said activated species having been created in a plasma discharge at a location remote from the chamber, and said primary precursor compound having not been subjected to a plasma discharge.

2. The process of claim 1, wherein said precursor compound is tetrakis-dimethylamido-titanium.

3. The process of claim 1, wherein said activated species reacts with the alkyl-nitrogen bonds of the primary precursor compound, and forms a volatile compound with the alkyl groups thereof.

4. The process of claim 3, wherein said substrate is heated by said susceptor plate to a temperature sufficient to cause remnants of said vaporized precursor compound to deposit on said substrate in the form of a titanium nitride film.

5. The process of claim 4, wherein said substrate is heated to a temperature within a range of 200°–600° C.

6. The process of claim 5, wherein said substrate is heated to a temperature of about 400° C.

7. The process of claim 3, wherein reaction products are removed from the chamber as the reaction proceeds.

8. The process of claim 3, wherein the walls of said chamber are maintained at a temperature that is insufficient to pyrolyze the primary precursor compound.

9. The process of claim 1, wherein said activated species is a halogen radical.

10. The process of claim 9, wherein said activated species is a chlorine radical.

11. The process of claim 9, wherein said activated species is a fluorine radical.

12. The process of claim 1, wherein said activated species is a hydrogen radical.

13. The process of claim 1, wherein said activated species is an $NF_3$ radical.

14. The process of claim 1, wherein said activated species is a $NH_3$ radical.

15. The process of claim 1, wherein said at least one carrier gas is utilized to transport the vaporized primary precursor compound into the chamber.

16. The process of claim 15, wherein said carrier gas is selected from a group consisting of the noble gases, nitrogen and hydrogen.

17. The process of claim 16, wherein said precursor compound is introduced into said carrier gas in a bubbler apparatus.

18. A chemical vapor deposition process for depositing a titanium nitride film on a semiconductor wafer comprising the steps of:

(1) disposing the semiconductor wafer on a heated susceptor plate within a chemical vapor deposition chamber;

(2) admitting at least one inert carrier gas into said chamber, said carrier gas being at least partially saturated with a metal-organic titanium compound as the primary precursor compound; and (3) admitting an activated species into said chamber, said activated species having been created in a plasma discharge at a location remote from the chamber, and said primary precursor compound having not been subjected to a plasma discharge.

19. The process of claim 18, wherein said primary precursor compound is tetrakis-dialkylamido-titanium.

20. The process of claim 19, wherein said activated species reacts with the alkyl-nitrogen bonds of the primary precursor compound, and forms a volatile compound with the alkyl groups thereof.

21. The process of claim 18, wherein said semiconductor wafer is heated by said susceptor plate to a temperature sufficient to cause remnants of said primary precursor compound to deposit on the surface of the wafer.

22. The process of claim 18, wherein said at least one carrier gas is selected from a group consisting of the noble gases, nitrogen and hydrogen.

*23. A chemical vapor deposition process for depositing a titanium nitride film on a semiconductor wafer comprising the steps of:*

*disposing the semiconductor wafer on a heated susceptor plate within a chemical vapor deposition chamber;*

*admitting into said chamber a metal-organic titanium compound as the primary precursor compound; and*

*admitting an activated species into said chamber, said activated species having been created in a plasma discharge at a location remote from the chamber, and said primary precursor compound having not been subjected to a plasma discharge.*

*24. The process of claim 23, wherein said primary precursor compound is tetrakis-dialkylamido-titanium.*

*25. The process of claim 24, wherein said activated species reacts with the alkyl-nitrogen bonds of the primary precursor compound, and forms a volatile compound with the alkyl groups thereof.*

*26. The process of claim 23, wherein said semiconductor wafer is heated by said susceptor plate to a temperature sufficient to cause remnants of said primary precursor compound to deposit on the surface of the wafer.*

*27. The process of claim 23, wherein a carrier gas is also admitted into the chamber.*

*28. The process of claim 27, wherein said carrier gas is selected from a group consisting of the noble gases, nitrogen and hydrogen.*

* * * * *